(12) United States Patent
Riani et al.

(10) Patent No.: US 11,277,224 B2
(45) Date of Patent: *Mar. 15, 2022

(54) SOFT FEC WITH PARITY CHECK

(71) Applicant: Marvell Asia Pte Ltd., Singapore (SG)

(72) Inventors: Jamal Riani, Fremont, CA (US);
Benjamin Smith, Ottawa (CA);
Volodymyr Shvydun, Los Altos, CA (US); Sudeep Bhoja, San Jose, CA (US); Arash Farhoodfar, Sunnyvale, CA (US)

(73) Assignee: Marvell Asia Pte Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 16/928,821

(22) Filed: Jul. 14, 2020

(65) Prior Publication Data

US 2020/0343999 A1 Oct. 29, 2020

Related U.S. Application Data

(63) Continuation of application No. 16/403,408, filed on May 3, 2019, now Pat. No. 10,749,629, which is a
(Continued)

(51) Int. Cl.
*H04L 1/00* (2006.01)
*H04B 14/02* (2006.01)
*H03M 13/29* (2006.01)

(52) U.S. Cl.
CPC ...... *H04L 1/0041* (2013.01); *H03M 13/2906* (2013.01); *H04B 14/023* (2013.01); *H04L 1/0058* (2013.01)

(58) Field of Classification Search
CPC ... H04L 1/0071; H04L 1/0042; H04L 1/0063; H04L 1/0046; H04L 1/0055;
(Continued)

(56) References Cited

U.S. PATENT DOCUMENTS 4,009,347 A 2/1977 Flemming
9,425,893 B1 8/2016 Srinivasan
(Continued)

OTHER PUBLICATIONS

A. Duel-Hallen, "Equalizers for multiple input/multiple output channels and PAM systems with cyclostationary input sequences," in IEEE Journal on Selected Areas in Communications, vol. 10, No. 3, pp. 630-639, Apr. 1992. (Year: 1992).*
(Continued)

*Primary Examiner* — Cynthia Britt
(74) *Attorney, Agent, or Firm* — Harness, Dickey & Pierce, P.L.C.

(57) ABSTRACT

A method for data transmission includes receiving a data stream from a host device, the data stream as received from the host device including encoded data, separating the encoded data in the data stream into first data blocks and second data blocks, and generating a first forward error correction (FEC) block. The first FEC block includes a first parity section and a first data section, the first parity section includes a first parity bit corresponding to the first data blocks and a second parity bit corresponding to the second data blocks, and the first data section includes the first data blocks and the second data blocks. The method further includes transmitting the first FEC block.

20 Claims, 11 Drawing Sheets

Related U.S. Application Data continuation-in-part of application No. 15/691,023, filed on Aug. 30, 2017, now Pat. No. 10,326,550.

(58) Field of Classification Search
CPC ... H04L 25/067; H04L 1/0045; H04L 1/0041; H04L 2001/0096; H04L 1/0058; H03M 13/1515; H03M 13/2906; H04B 14/023
See application file for complete search history.

(56) References Cited

U.S. PATENT DOCUMENTS

| | | |
|---|---|---|
| 10,326,550 B1 | 6/2019 | Riani et al. |
| 10,749,629 B2 * | 8/2020 | Riani .................... H04L 1/0041 |
| 2002/0049947 A1 | 4/2002 | Sridharan |
| 2007/0115803 A1 | 5/2007 | Geile |
| 2012/0076183 A1 * | 3/2012 | Dapper .................. H04H 60/97 375/219 |
| 2015/0288491 A1 * | 10/2015 | Baek .................... H04L 1/0045 370/312 |
| 2018/0123613 A1 | 5/2018 | Szczepanek |
| 2020/0358543 A1 | 11/2020 | Oh et al. |

OTHER PUBLICATIONS

IEEE Draft Standard for Ethernet Amendment 10: Media Access Control Parameters, Physical Layers and Management Parameters for 200 Gb/s and 400 Gb/s Operation, in IEEE P802.3bs(TM)/D3. 23.3, Jul. 2017 , vol., No., pp. 1-393, Jan. 1, 2017.

* cited by examiner

SOFT FEC WITH PARITY CHECK

CROSS-REFERENCES TO RELATED APPLICATIONS

This application is a continuation application claiming priority to U.S. patent application Ser. No. 16/403,408, entitled "SOFT FEC WITH PARITY CHECK", filed May 3, 2019, which is a continuation-in-part application claiming priority to U.S. patent application Ser. No. 15/691,023, entitled "SOFT FEC WITH PARITY CHECK", filed Aug. 30, 2017, which are incorporated by reference herein for all purposes.

STATEMENT AS TO RIGHTS TO INVENTIONS MADE UNDER FEDERALLY SPONSORED RESEARCH AND DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention is directed to data communication systems and techniques thereof.

Over the last few decades, the use of communication networks has exploded. In the early days of the Internet, popular applications were limited to emails, bulletin board, and mostly informational and text-based web page surfing, and the amount of data transferred was relatively small. Today, the Internet and mobile applications demand a huge amount of bandwidth for transferring photo, video, music, and other multimedia files. For example, a social network like Facebook processes more than 500 TB of data daily. With such high demands on data storage and data transfer, existing data communication systems need to be improved to address these needs.

There are both existing and proposed standards and protocols for data communication. One of the proposed data communication protocol is 802.3bs, which is intended for high speed data transfer. Improving aspects of high-speed communication techniques (e.g., 802.3bs protocol and 802.3cd) is desired.

BRIEF SUMMARY OF THE INVENTION

The present invention is directed to data communication systems and techniques thereof. More specifically, embodiments of the present invention provide an FEC encoder that generates parity symbols that are embedded into FEC blocks. An FEC decoder determines whether to perform error correction based on the parity symbols. When performing error correction, the decoder selects a worst symbol from a segment of symbols, and the worst symbol is corrected. There are other embodiments as well.

According to an embodiment, the present invention provides a data transmission device, which includes an interface for receiving a data stream. The device also includes an alignment marker framer configured to frame the data stream. The device further includes a delay line configured to delay a predetermined number of bits of data stream to provide an even data block. The device additionally includes a multiplexer configured to output the even data block and an odd data block. The device includes an encoder configured to generate a plurality of forward error correction (FEC) blocks. Each of the FEC blocks has an odd section and an even section and a parity section. The FEC blocks includes a first FEC block, which has an even parity bit corresponding to the even data block and an odd parity bit corresponding to the odd data block. The device additionally includes a transmission module for transmitting the FEC blocks.

According to yet another embodiment, the present invention provides a decoding device, which includes a communication interface for receiving a data stream comprising a plurality of PAM symbols. The device also includes a mapping module for generating an FEC block based the plurality of PAM symbols. The FEC block has a parity symbol and a plurality of odd symbols and a plurality of even symbols. The device further includes a decoding module configured to perform parity check using the parity symbol and the odd symbols. The decoding module is configured to generate even blocks and odd blocks. The device also includes an alignment marker framer configured to distinguish between even blocks and odd blocks. The device further includes a delay linSpee for delaying the odd blocks by a predetermined number of bits. The device also includes a de-interleaver for providing a data stream by aligning the even blocks and odd blocks.

It is to be appreciated that embodiments of the present invention provide many advantages over conventional techniques. Among other things, encoder and decoder modules according to embodiments of the present invention can be easily adopted into existing systems. For example, in a PAM4 based high-speed data communication system (e.g., 802.3bs and 802.3cd), encoder and decoder modules are implemented as outer modules that add onto existing communication chips with RS encoding scheme. The addition of parity symbol FEC according to embodiments of the present invention adds little transmission overhead (1/21), and low-power implementation can be achieved. As explained above, FEC techniques according to the present invention can readily provide over 1.5 dB of coding gain. With interleaving mechanism, parity-symbol FEC can be used in different data transmission modes, including but not limited to 50G and 100G modes.

Embodiments of the present invention can be implemented in conjunction with existing systems and processes. For example, parity symbol-based error check and correction can be easily adapted into existing communication system. Encoding and decoding modules according to embodiments of the present invention can be readily manufactured using existing manufacturing processes and systems. There are other benefits as well.

The present invention achieves these benefits and others in the context of known technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

Figure 1A:
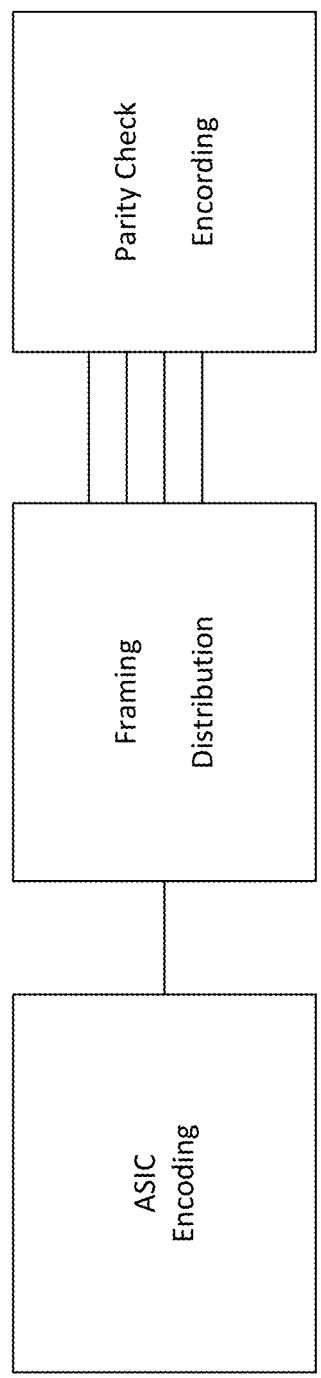
FIG. 1A is a simplified block diagram illustrating a data transmission device according to an embodiment of the present invention.

The present invention is directed to data communication systems and techniques thereof. More specifically, embodiments of the present invention provide an FEC encoder that generates parity symbols that are embedded into FEC blocks. An FEC decoder determines whether to perform error correction based on the parity symbols. When performing error correction, the decoder selects a worst symbol from a segment of symbols, and the worst symbol is corrected. There are other embodiments as well.

As explained above, it is desirable to improve data rate and accuracy in data communication systems. For example, in high-speed data communication systems, Reed-Solomon (RS) encoding is often used. In various embodiments, the present invention take advantage of existing encoding scheme sand uses parity symbol to improve accuracy and performance of data transmission.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

FIG. 1A is a simplified block diagram illustrating a data transmission device according to an embodiment of the present invention. This diagram is merely an example, which should not unduly limit the scope of the claims. One of ordinary skill in the art would recognize many variations, alternatives, and modifications. As shown in FIG. 1A, at the top level, an ASIC section encodes signals for transmission. For example, RS encoding is performed. The framing and distribution section encode signals that are framed into data blocks and distributes the data blocks to different communication channels. The parity check and encoding section performs parity check and inserts parity bits into data blocks.

Figure 1B:
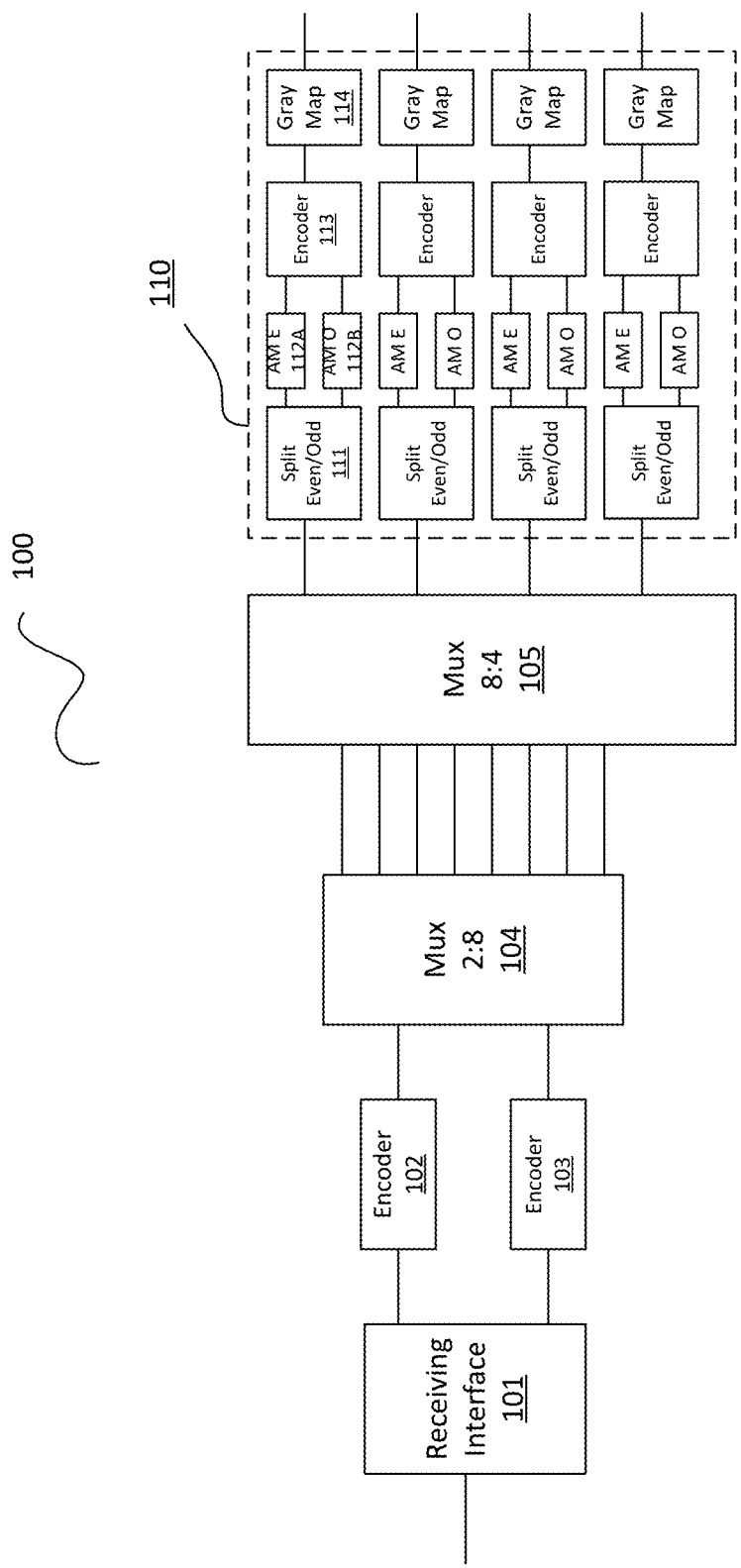
FIG. 1B is a simplified diagram illustrating a data transmission device 100 according embodiments of present invention.

FIG. 1B is a simplified diagram illustrating a data transmission device 100 according embodiments of present invention. This diagram is merely an example, which should not unduly limit the scope of the claims. One of ordinary skill in the art would recognize many variations, alternatives, and modifications. In various embodiments, the data transmission device is configured in compliance with 802.3bs standard, but it is understood that other communication standards and protocols may be used as well. For example, the data transmission device 100 can be configured for transmitting data at a rate of 400 Gbps or higher. Data at a high transmission rate are received and processed by receiving interface 101. For example, data may be received via copper wires and/or optical communication channels. The received data are encoded by encoder 102 and encoder 103. According to various embodiments, encoder 102 comprises Reed-Solomon (RS) encoder that encodes and generates a first data stream. For example, the first data stream is divided into 10-bits blocks, which may be specified by a predetermined encoding scheme. For example, the RS encoder uses RS (544, 514) encoding scheme. Similarly, encoder 103 is (similar to encoder 102) implemented with an RS encoder to generate a second data stream with 10-bits blocks. The first data stream and the second data stream, respectively generated by encoder 102 and encoder 103, are distributed into eight communication lanes by multiplexer 104. For example, each of the eight communication lanes transmits data blocks from both the first data stream and the second data stream. In various embodiments, the eight communication lanes are physical coding sublayer (PCS) lanes, and each of the eight communication lanes transmits data from both the first data stream and the second data stream. For example, data blocks from the first data stream and the second data stream can be interleaved according to a predetermined pattern. Multiplexer 105 distributes data streams from the eight communication lanes into four communication lanes. For example, the four communication lanes can be CDAUI lanes. It is to be appreciated that according to embodiments of the present invention, interface 101, encoder 102, encoder 103, multiplexer 104, and multiplexer 105 are configured as components of a host chip. For example, encoder module 110 is implemented as a separate chip that is coupled to the host chip. Encoder module 110 provides forward error correction (FEC) that reduces bit-error rate (BER) and improves performance.

As shown in FIG. 1B, encoder module 110 includes four encoder lanes, which correspond to the four communication lanes from multiplexer 105. For example, the four encoder lanes perform encoding in parallel, and the encoder module 110 is substantially insensitive to PCS lane skews. Data streams on each of four communication lanes include data blocks encoded by both encoder 102 and encoder 103. As described above, each of the data blocks includes 10 bits. At encoder module 110, each of the encoder lanes includes a splitter module, a pair of amplitude modulation (AM) lock modules, an encoder module, and a Gray mapping module. More specifically, an encoder lane of the encoder module 110 first splits the incoming data streams into even and odd bits. As an example, splitter module 111 splits a data stream from multiplexer 105 into even and odd bits. Even bits are then processed by even AM ("AM E" in FIG. 1B) lock module 112A, and odd bits are processed by odd AM ("AM 0") lock module 112B. The AM lock modules 112A and 112B are configured to determine and lock boundary for RS symbols by using amplitude modulation techniques. For example, AM lock module 112A generates a stream of even data blocks, and AM lock module 112B generates a stream of odd data blocks. Encoder 113 encodes even data blocks and odd data blocks into forward-error correction (FEC) blocks. In various embodiments, each of the FEC blocks includes an even section, an odd section, and a parity section. The even section includes ten even data blocks (e.g., PAM4 symbols). The odd section includes ten odd data sections. The parity section includes an even parity bit corresponding to the even section and an odd parity bit corresponding to the odd section. For example, the parity section is later mapped into a PAM4 parity symbol. The Gray mapping module 114 maps FEC blocks into an output data stream for transmission. For example, the output data stream can be transmitted through various types of communication links at high speed.

Figure 2:
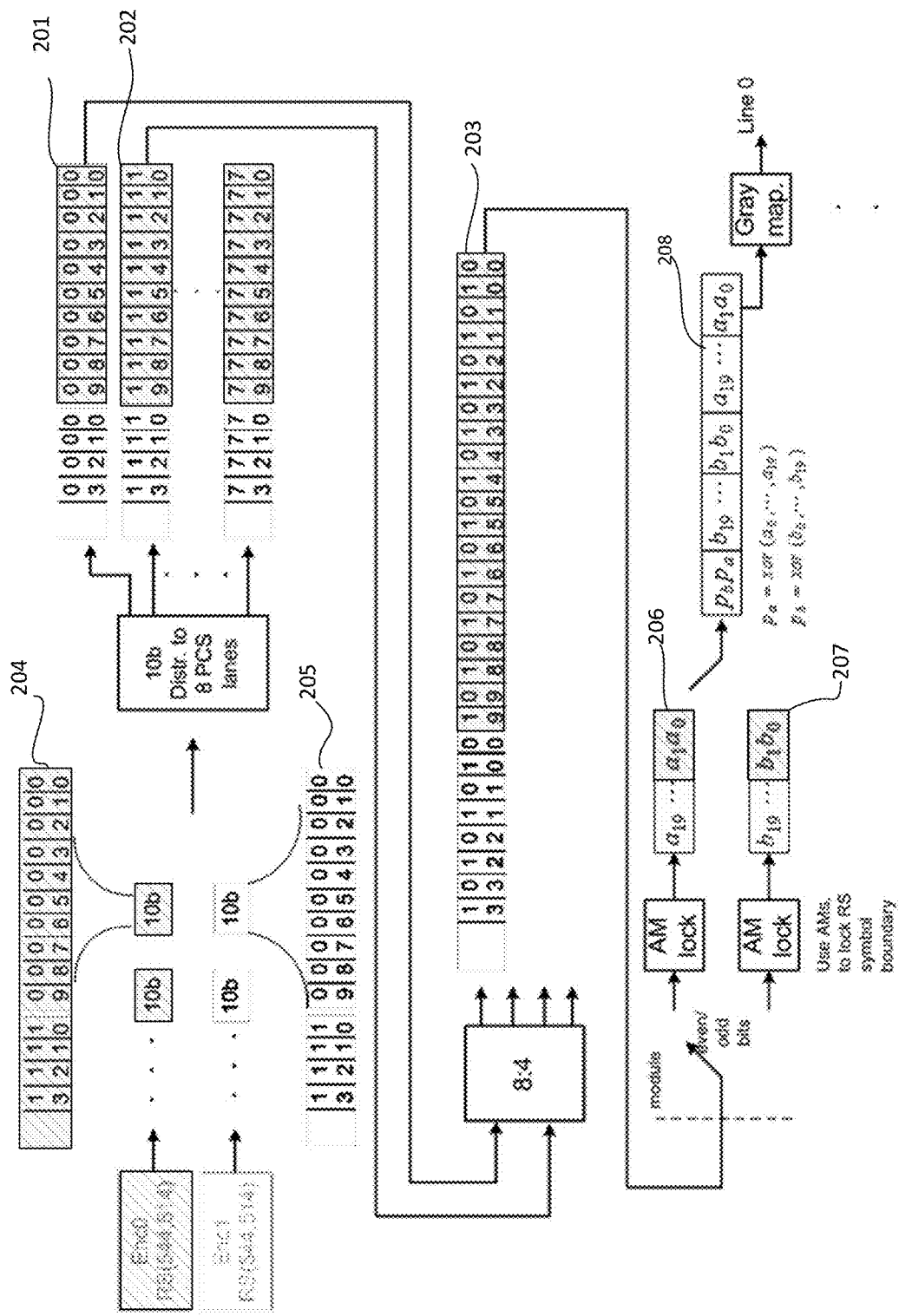
FIG. 2 is a simplified diagram illustrating data encoding according to embodiments of the present invention.

FIG. 2 is a simplified diagram illustrating data encoding according to embodiments of the present invention. This diagram is merely an example, which should not unduly limit the scope of the claims. One of ordinary skill in the art would recognize many variations, alternatives, and modifications. For example, FIG. 2 can be used to illustrate operation of data transmission device 100. As shown in FIG. 2, two encoders (Enc0 and Enc1) generate two data streams 204 and 205 as shown, and each of the data streams includes 10-bit data blocks. For example, shaded bits are generated by Enc0 and non-shaded bits are generated by Enc1. The two data streams 204 and 205 are then distributed to eight communication lanes (e.g., 8 PCS lanes) as eight data streams. It is to be appreciated that the encoded data can be distributed and multiplexed in other ways, and FIG. 2 merely provides a specific example. For example, data stream 201 includes alternating 10-bit data blocks from both data streams 204 and 205; data stream 202 also includes alternating 10-bit data blocks from both data streams 204 and 205. The eight data streams from the eight PCS lanes are then distributed by the 8:4 multiplexer as shown. An exemplary arrangement of data blocks is shown. Data stream 203 combines (or interleave) data blocks from data streams 201 and 202. More specifically, data stream 203 includes interleaved blocks of data blocks from data stream 201 and 202.

As described above, the four data streams are then encoded by the encoding module. For example, data stream 203 (one of the four data streams) is split into an even data stream 206 and an odd data stream 207. In various implementations, data stream 206 includes segments of even data bit symbols (e.g., 10 data symbols $a_0$ to $a_{19}$); data stream 207 includes segments of odd data bit symbols (e.g., 10 data symbols $b_0$ to $b_{19}$). The data symbols are provided by amplitude modulation locking modules, where the symbols are locked based on RS symbol boundary. Data streams 206 and 207 are then encoded and combined. For example, FEC encoding is performed on data streams 206 and 207. The resulting data stream 208 includes FEC blocks. In various implementations, FEC data blocks each includes 21 symbols: 10 even symbols, 10 odd symbols, and a parity symbol. For example, the even symbols (e.g., symbol $a_1a_0$) are positioned in a continuous segment, and the odd symbols (e.g., symbol $b_1b_0$) are positioned in a continuous segment adjacent to the even segment. The parity symbol includes two parity bits: pa corresponding to even segment 206, and $p_b$ corresponding to the odd segment 207. The FEC blocks are then mapped using Gray mapping for transmission. For example, the FEC blocks are transmitted using PAM protocol. For example, PAM4 may be used for data transmission. For data transmission, the parity symbol can provide a coding gain of about 1.65 dB.

It is to be appreciated that the use of parity symbols as a part of the encoding module can be implemented to compliment 802.3bs data communication systems. For example, on the communication lane, 21 PAM4 symbols meet two even parity constraints. The addition of parity symbols increases the data rate of the communication line. For example, the data rate increase from 26.5625e9 to 26.5625e9*21/20=27.890625 GHz. And in implementation, four 52 Gb/s Rx/DSP cores operate in parallel.

Embodiments of the present invention provide decoding devices and techniques to take advantage of encoding techniques described above. For example, a decoder module determines the existence of error at a given FEC block using the parity symbol. A maximum likelihood decoder is then used to locate the error symbol within the FEC block, and the error symbol is corrected using a "flip" function, which is described in further detail below.

An FEC block (e.g., FEC block 208) in FIG. 2, which is encoded with a parity symbol, includes 21 symbols. For example, after performing Gray mapping, PAM4 symbols transmitted over a communication includes one (21, 20) FEC block as $[d_0, d_1, \ldots, d_{20}]$, where $d_{20}$ is the parity symbol resulting from the Gray mapping of the 2 parity bits. For example, $d_0$-$d_9$ correspond to even blocks in FIG. 2, $d_{10}$-$d_{19}$ correspond to odd blocks, and $d_{20}$ corresponds to the parity block. By definition do is the first transmitted symbol and $d_{20}$ is the last one. The two even parity constraints can be expressed, after Gray mapping, in terms of PAM4 symbols $d_i$, using Equation 1 below:

Equation 1:

$$\oplus_{i=0}^{9} d_i[0] = d_{20}[0] \oplus d_{20}[1] \quad \text{(par 1)}$$

$$\oplus_{i=10}^{19} d_i[0] = \text{pol} \oplus d_{20}[1] \quad \text{(par 2)}$$

In Equation 1, the symbol ⊕(xor) denotes additions and pol is a polarity inversion flag based on the polarity inversion. For example, polarity inversion detection is used as a part of the FEC word synchronization.

Figure 3:
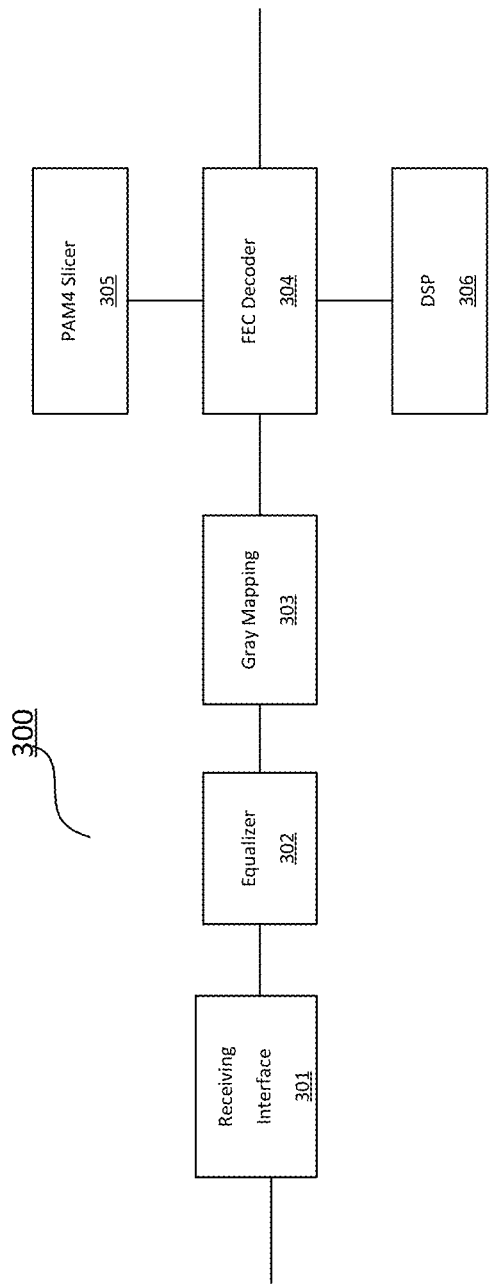
FIG. 3 is a simplified diagram illustrating a receiver device according to an embodiment of the present invention.

FIG. 3 is a simplified diagram illustrating a receiver device according to an embodiment of the present invention. This diagram is merely an example, which should not unduly limit the scope of the claims. One of ordinary skill in the art would recognize many variations, alternatives, and modifications. For example, receiver device 300 processes signals received from data transmission device 100 illustrated in FIG. 1B. More specifically, receiver device 300 uses parity symbols for error correction.

Incoming data are received through receiving interface 301. Equalizer 302 processes (e.g., equalization) the incoming data for further processing. Gray mapping is performed by the Gray mapping module 303, which yields PAM4 symbols. The PAM4 symbols are grouped into FEC blocks. As explained above, a single FEC block includes 21 symbols: 10 odd symbols, 10 even symbols, and a parity symbol. For example, based on the final equalizer output $x_1$, the FEC decoder 304 first achieves FEC block synchronization. Usually, the synchronization process is not overly complex. For example, after equalization and synchronization, FEC blocks processed by FEC decoder 304 are provided as $[x_0, x_1, \ldots, x_{20}]$. The FEC decoder 304 receives 21 PAM4 preliminary decisions, $d_i$, from the PAM4 slicer 305, where each $d_i$ symbol is 2-bit binary. FEC decoder 304 further receives three optimal threshold values for each one the 3 sub-eyes (of the four PAM4 eye levels) from DSP 306.

For the purpose of illustration, threshold for the eye levels are denoted as Th(eye id), where eye id=0,1,2. In an exemplary implementation, Th(0) and Th(2) are 9.6 and Th(1) is 7.6. For each of the 21 symbols in an FEC block, there are corresponding 21 2-bit 2b eye_id∈{0, 1, 2}, and each is denoted as $E_i$. For example, $E_i$ indicates the sub-eye at which belongs sample $x_1$. For example, by having sign of the error signal for all bauds (e.g., generated by DSP 306), $E_i$ can be easily determined. In various embodiments, a single bit polarity inversion pol is used.

As explained above, FEC decoder 304 uses the parity symbol to determine whether error correction is to be performed. And if error correction is to be performed based on the parity symbol, the symbol with the highest likelihood to be erroneous is "flipped". To locate the erroneous bit, log likelihood ratio (LLR) calculation is performed for each data symbol $x_1$ of the given FEC block. The data symbol corresponding the lowest LLR value within a data segment is selected as the "worst" symbol and most likely to be erroneous. The PAM4 levels after equalization are denoted as L(d) and the noise variance per level is denoted as $\sigma^2(d)$. Knowing the coding of FEC is much smaller than 6 dB, the decoder is configured to only flip PAM4 symbols within the same sub-eye. Given $x_i$ and $d_i$ and if we denote $d'_i$ for the other PAM4 symbol from the same sub-eye $E_i$, the value of log-likelihood ratio (LLR) be expressed by Equation 2 below:

$$LLR(x_i) = \left[\left(\frac{1}{\sigma(d_i)} + \frac{1}{\sigma(d'_i)}\right)x_i - \frac{L(d'_i)}{\sigma(d'_i)} - \frac{L(d_i)}{\sigma(d_i)}\right] \times$$

$$\left[\left(\frac{1}{\sigma(d'_i)} - \frac{1}{\sigma(d_i)}\right)x_i - \frac{L(d'_i)}{\sigma(d'_i)} + \frac{L(d_i)}{\sigma(d_i)}\right]$$

Equation 2

For example Equation 2 can be simplified to Equation 3 below:

$$LLR(x_i) = K(E_i) \times (x_i - Th(E_i))$$

Equation 3

$$\text{where, } K(E_i) = \left(\frac{1}{\sigma(d_i)} + \frac{1}{\sigma(d'_i)}\right) \times \left|\frac{L(d_i)}{\sigma(d_i)} + \frac{L(d'_i)}{\sigma(d'_i)}\right|$$

Figure 4:
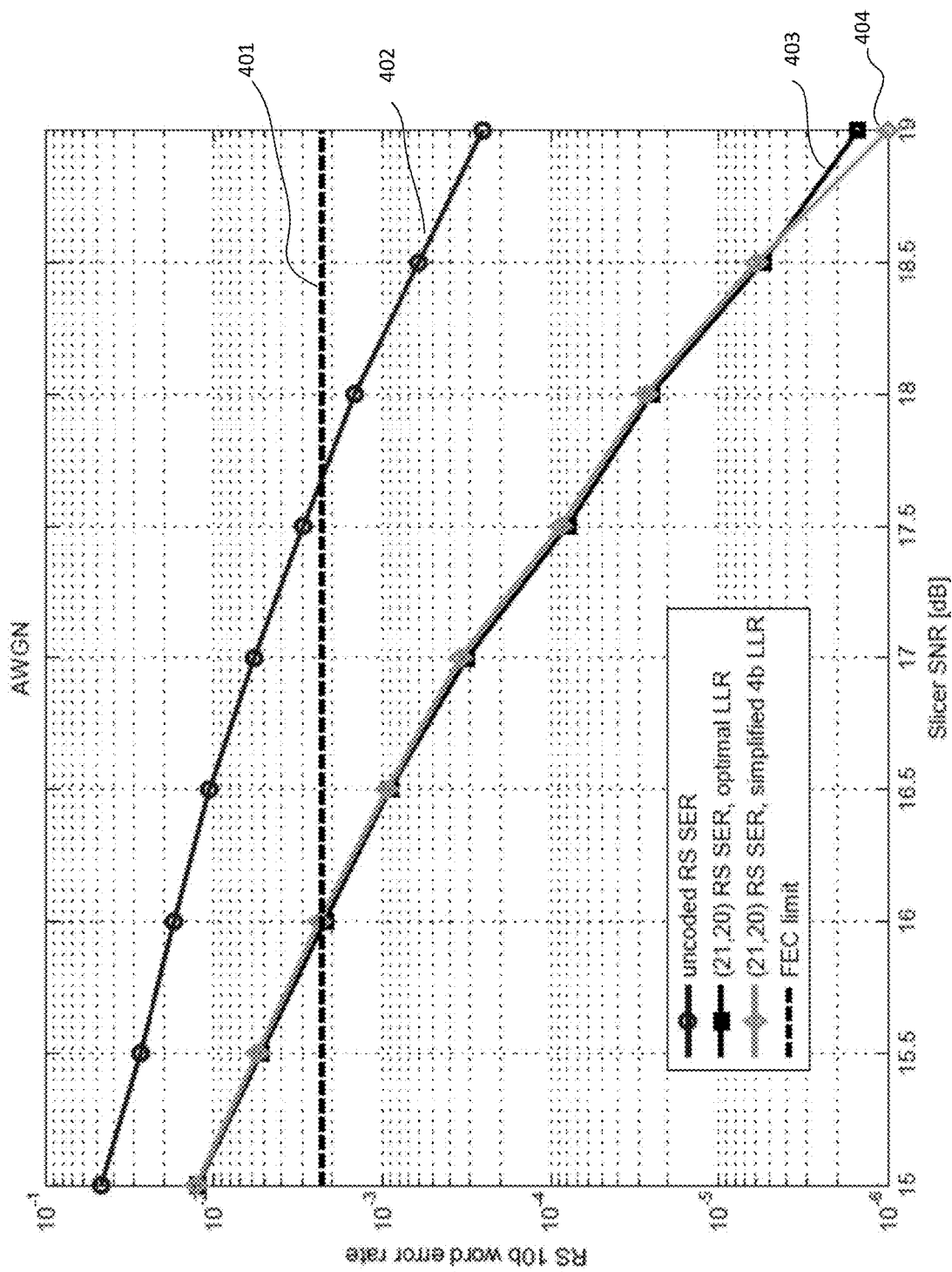
FIG. 4 is a graph illustrating benefits of using LLR values in error corrections.

The term K(Ei) in Equation 3 intuitively conveys the sub-eye SNR information. The closer $x_i$ is from the corresponding threshold, the lower LLR gets. FIG. 4 is a graph illustrating benefits of using LLR values in error corrections. More specifically, FIG. 4 illustrates RS 10-bit word error rate versus slicer SNR (or PAM4). As can be seen in FIG. 4, the FEC limit shown as dash line 401. The error rate associated with decoding with optimal LLR is illustrated by curve 403. The error rate associated with decoding with simplified 4-bit LLR is illustrated by curve 404. As graph in FIG. 4 clearly demonstrates, the error rates associated with decoding that uses LLR (optimal or simplified 4-bit) are much lower than error rate associated with uncoded RS (curve 402).

Figure 5:
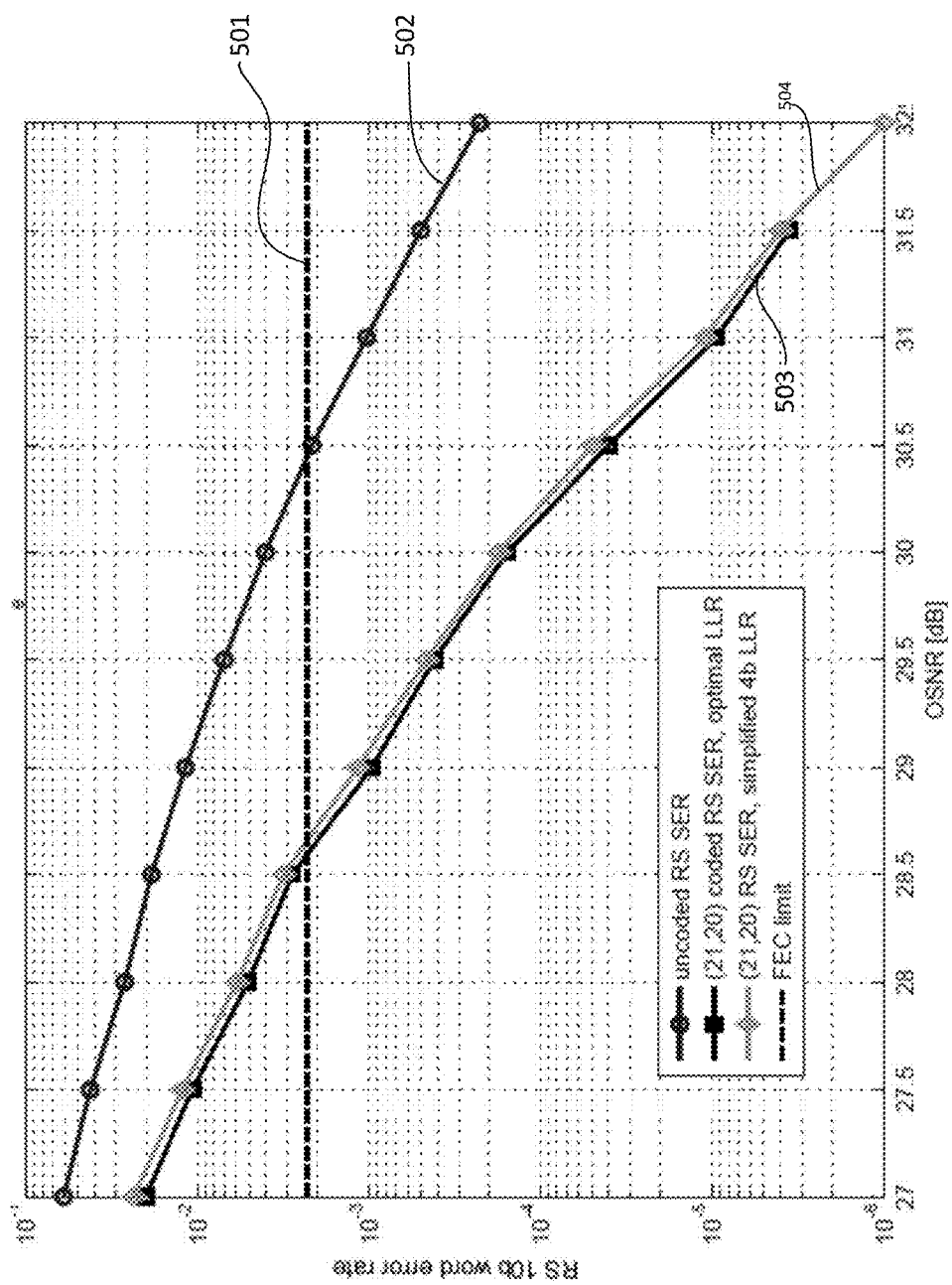
FIG. 5 is a graph illustrating relationship between RS symbol error rate versus PAM4 Optical Signal-To-Noise Ratio (OSNR).

FIG. 5 is a graph illustrating relationship between RS symbol error rate versus PAM4 Optical Signal-To-Noise Ratio (OSNR). The FEC limit shown as dash line 501. The error rate associated with decoding with optimal LLR is illustrated by curve 503. The error rate associated with decoding with simplified 4-bit LLR is illustrated by curve 504. The benefit of using LLR values is clear in the context of optical communication: the error rates associated with decoding that uses LLR (optimal or simplified 4-bit) are much lower than error rate associated with uncoded RS (curve 502).

Concerning the range of SNR (e.g., FIG. 4) and OSNR (e.g., FIG. 5) of interest, one could ignore the eye-dependent term K(E) and truncate the LLR to a relatively low resolution. Also, because the decoding scheme only requires the absolute value of LLR, the term abs($x_i$-Th($E_i$)) can be truncated to low resolution and possibly saturated. The terms ($x_i$-Th($E_i$)) are already computed as part of the slicer logic.

Figure 6:
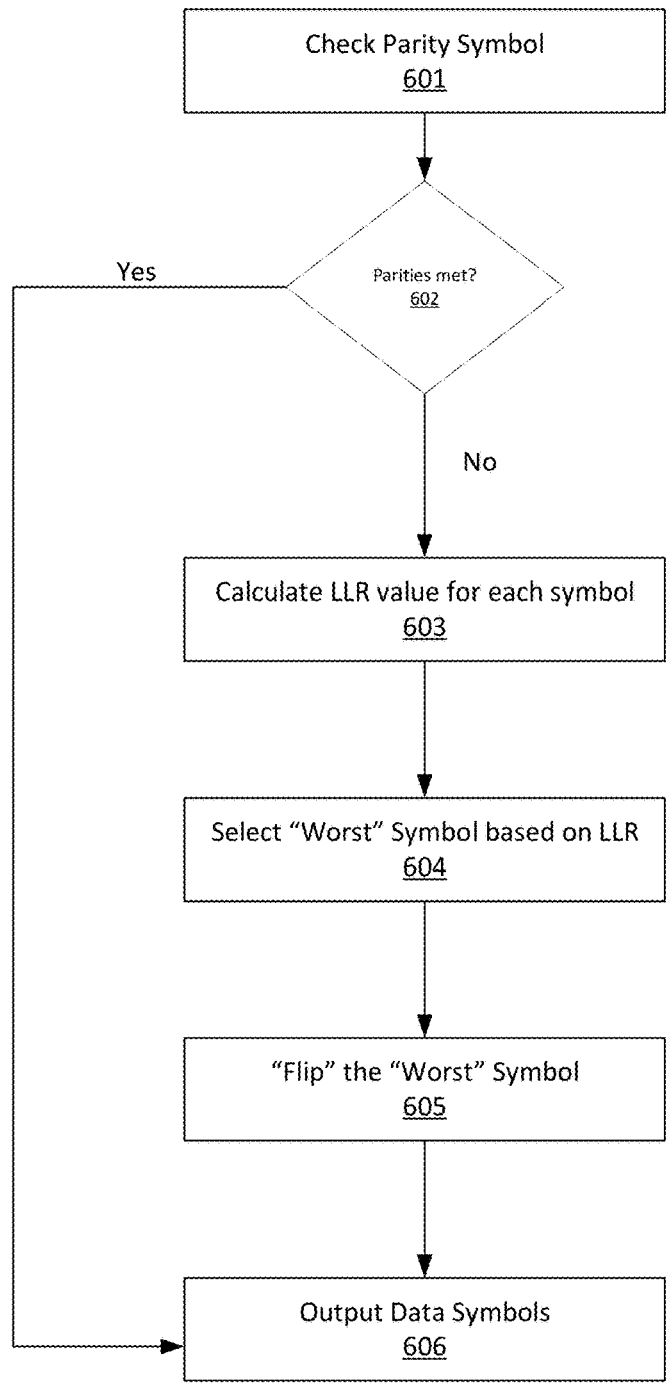
FIG. 6 is a simplified flow diagram illustrating an exemplary decoder error correction technique according to embodiments of the present invention.

FIG. 6 is a simplified flow diagram illustrating an exemplary decoder error correction technique according to embodiments of the present invention. This diagram is merely an example, which should not unduly limit the scope of the claims. One of ordinary skill in the art would recognize many variations, alternatives, and modifications. For example, one or more steps may be added, removed, repeated, rearranged, modified, replaced, and/or overlapped, which should limit the claims.

Step 601. Upon receiving an FEC block with 21 symbols, the decoder first check the parity symbol to determine whether there are one or more parity errors. In various embodiments, a parity symbol includes an even parity bit for 10 even symbols and an odd parity bit for 10 odd parity symbols. For example, the 10 even symbols are first ten symbols of the FEC block, and the 10 odd symbols are the second ten symbols of the FEC block. For example, Equation 1 is used to perform parity check.

Equation 1:

$$\oplus_{i=0}^{9} d_i[0] = d_{20}[0] \oplus d_{20}[1] \quad \text{(par 1)}$$

$$\oplus_{i=10}^{19} d_i[0] = \text{pol} \oplus d_{20}[1] \quad \text{(par 2)}$$

For example, if the parity of the given FEC block is incorrect, the parity inversion flag pol is set.

Step 602. Based on the parity check performed at step 601, the decoder determines whether to perform error correction. For example, if the parity symbol checks out, the decoder simply output the 20 symbols without error correction, and the decoding process proceeds to step 606. On the other hand, if the parity symbol does not check out (e.g., based on Equation 1), error correction is needed, and the process proceeds to step 603.

Step 603. Once it is determined that error correction is to be performed, the decoder needs to locate the erroneous symbol and perform error correction on the erroneous symbol. As explained above, likelihoods of error for the data symbols is selected based their respective LLR values. In various embodiments, a first minimum LLR is determined for the first segment (i.e., first group of ten symbols) of the FEC block and a second minimum LLR is determined for second segment (i.e., second group of ten symbols) of the FEC block.

At step 604, symbols that are most likely to be erroneous ("worst" symbols) are selected. For example, the "worst" symbol(s) are the symbols associated with the lowest LLR values, and respectively there is a worst symbol for the first segment and another worst symbol for the second segment. The selection of "worst" symbols using LLR values is explained above. It is to be appreciated that the "worst" symbols can be selected using other techniques and/or algorithms as well. While there are worst symbols for both the first segment and the second segment of symbols (the term "worst" describes the relative likelihood of being erroneous within a segment), actual error correction or "flip" of worst symbol(s) is performed only if the corresponding parity bits is "off" for the corresponding segment of symbols. Correcting of "flipping" of the worst symbol is performed at step 605.

Figure 7:
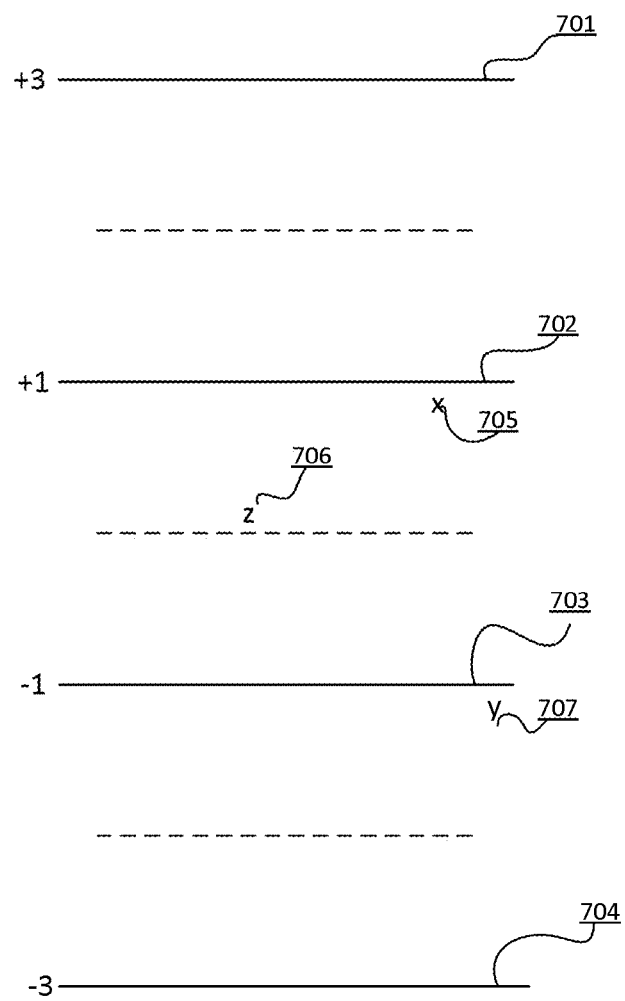
FIG. 7 is simplified eye level diagram according to embodiments of the present invention.

Step 605. At step 605, the worst symbol is changed to its next nearest value. For example, the "flipping" of symbol values can be illustrated and explained in FIG. 7. FIG. 7 is simplified eye level diagram according to embodiments of the present invention. This diagram is merely an example, which should not unduly limit the scope of the claims. One of ordinary skill in the art would recognize many variations, alternatives, and modifications. Four levels (+3, +1, −1, and −3) are provided for PAM4 communication. Each of the incoming data symbols, once decoded, is assigned to one of the four levels. In ideal cases, a data symbol would be very close to one of the four levels and thus easily assigned. For example, symbol "x" is close to level "+1" and is assigned to "+1". Similarly, symbol "y" is close to level "−1" and is assigned to "−1". For a symbol that is close to the middle positions (e.g., three dashed lines between the four levels), the likelihood of symbol error is high. For example, symbol "z" is very close to the middle dash line between level "+1" and level "−1". Assume symbol "z" is processed and decoded correctly, it would be assigned to "+1". However, if the parity bit indicates that there is a wrong symbol, symbol "z" is much more likely to be erroneous than symbols "x" and "y", and thus should be "flipped" to the next nearest level, which is "−1". In such way, the symbols that are closest to the dashed line are the worst symbols. Similarly, for an erroneous symbol positioned between "+1" and "+3", flipping the symbols means changing the symbol value from "+1" to "+3" or the other way around; for an erroneous symbol positioned between levels "−1" and "−3", flipping the symbols means changing the symbol value from "−1" to "−3" or the other way around.

Now referring back to FIG. 6. Depending on the parity check results, one or more "worst" symbols are corrected by flipping to the second nearest PAM level. Once symbol correction is performed, the decoder proceeds to step 606 to output data symbols.

Depending on the implementation, the corrected data symbols are then processed in reverse to the data flow process illustrated in FIG. 2. For example, data symbols are recombined into data streams and RS decoding is later performed.

The decoding/correction processed illustrated in FIG. 7 can be implemented using the pseudo code below:

```
1. Check the parity equations based on the preliminary decisions.
   Equation 1 is used to determine par1 and par2.
2. If parities are met, output (d_i)_{0≤i≤19}. If not go to step 3.
3. Calculate the minimum value and index of ALLR i for i =0. . .9.
   Call it v_0 (ALLR value) and i_0 (index). Do same for ALLR i
   for i=10. . .19, call the results v_1 and i_1.
4. If par1 is false:
   if E_{20} == 0 or E_{20} == 2, (v_0 < ALLR_{20}) ? flip(di_0,Ei_0).
   if E_{20} == 1, flip(di_0,Ei_0).
5. if par2 is false:
   if E_{20} == 0 or E_{20} == 2, flip(di_1 ,Ei_1).
   if E_{20} == 1, (v_1 < ALLR_{20}) ? flip(di_1,Ei_1 ).
```

As an example, the flip(d,E) function above is illustrated in FIG. 7, which is to output the other PAM4 symbol of the eye E and can be implemented using the following pseudo code:

```
out[0]=not d[0]
```

```
out[1]=xor(d[1],E[0])
```

Figure 8:
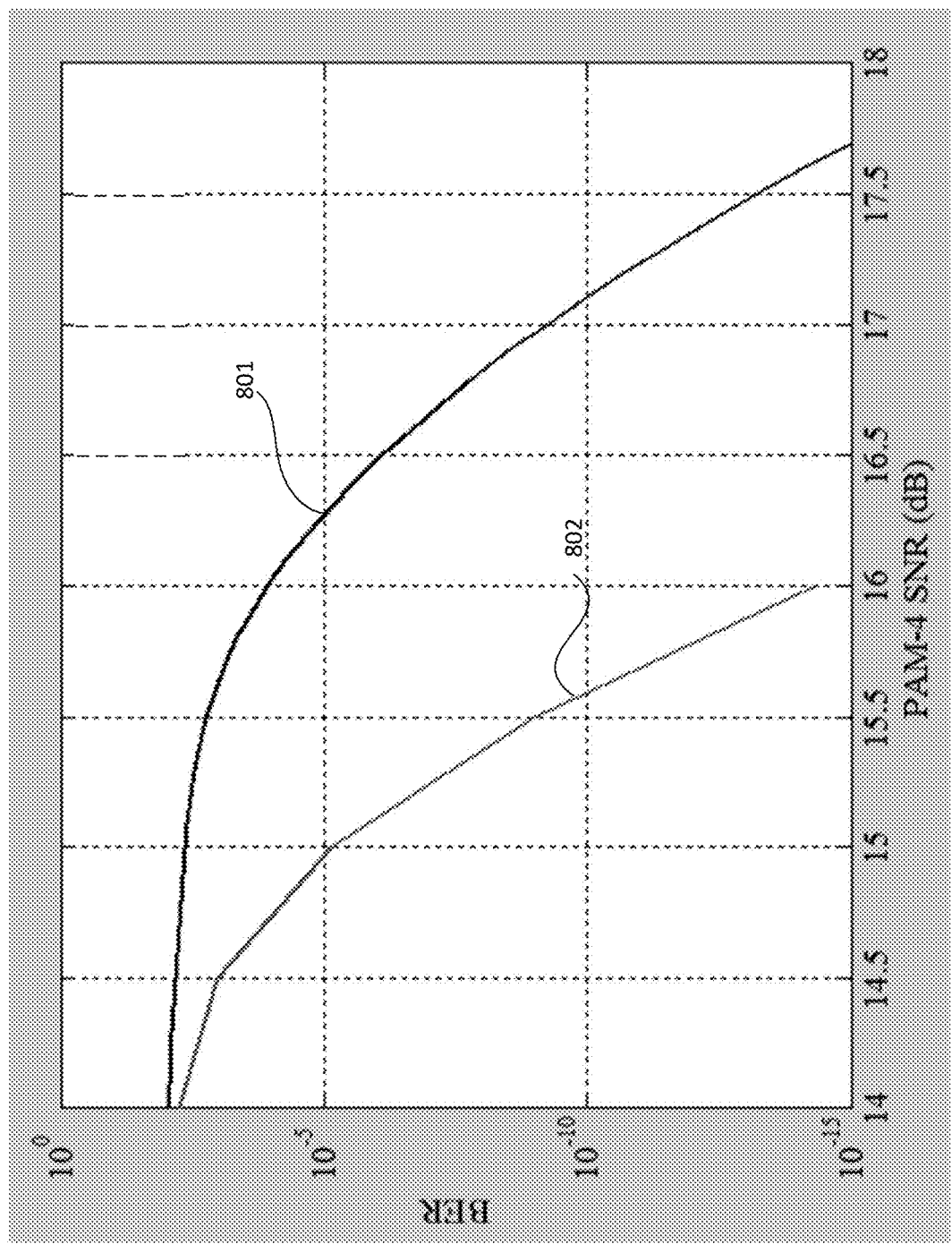
FIG. 8 is a graph illustrating the coding gain obtained by using the parity symbols according to embodiments of the present invention.

It is to be appreciated that the use of parity symbols and correcting "worst" symbols can effectively improve data transmission. FIG. 8 is a graph illustrating the coding gain obtained by using the parity symbols according to embodiments of the present invention. Curve 802 illustrates bit-error-rate (BER) of data transmission when parity symbols are used, and curve 801 illustrates BER when parity symbols are not used. At the same PAM SNR levels, the use of parity symbols can effectively reduce BER and thus improve performance. For example, the use of parity symbols provides a coding gain of 1.65 dB coding gain, or PAM4 SER=3.4E-3. Taking the overhead of adding parity symbol, the net coding gain is about 1.45 dB, which is calculated from 1.65-10 log 10*(21/20). It is also to be appreciated the both encoder and decoder that use the parity symbol can be implemented using power efficient chips.

In 200G and 400G Ethernet applications, uncorrectable parity check blocks are distributed to two independent encoders for processing. For example, as shown in FIG. 1B, received data are processed by encoder 102 and encoder 103 (see also Enc0 and Enc1 in FIG. 2). However, for 50G and 100G data transmission modes, only one FEC encoder (e.g., RS FEC or KP FEC) is allocated for each physical lane. Referring back to the FIGS. 1B and 2 (and descriptions thereof), each uncorrectable parity check block is distributed to two independent FEC (e.g., RS or KP FEC) encoder blocks (per standard) and hence the overall coding gain is the sum of parity check gain and FEC coding gain. In various embodiments, incoming data for a data lane are interleaved into independent FEC blocks, which allows for the single FEC block to process the parity check information described above.

Figure 9:
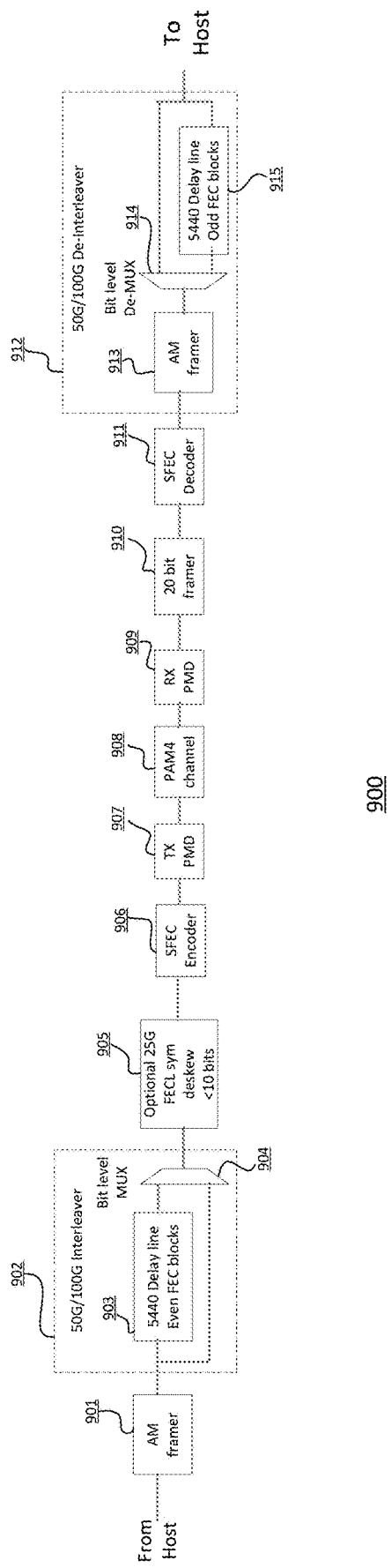
FIG. 9 is a simplified block diagram illustrating a data transmission system 900 according to an embodiment of the present invention.

FIG. 9 is a simplified block diagram illustrating a data transmission system 900 according to an embodiment of the present invention. This diagram is merely an example, which should not unduly limit the scope of the claims. One of ordinary skill in the art would recognize many variations, alternatives, and modifications. It is to be understood that depending on the implementation, a communication device may include some functional blocks of the data transmission system 900. For example, a transceiver device, as implemented according to embodiments of the present invention, includes both a receiving side and a transmitting side. An exemplary transmission device would receive data from a host device, and process data with blocks 901-907, and transmit data through the PAM4 channel 908. A receiving device would receive data from PAM4 channel 908, process data with blocks 909-915, and provide the data to another host device as shown. There can be other variations according to embodiments of the present invention as well.

Data received from the host is first processed by alignment marker (AM) framer 901. Typically, there is an alignment marker stream embedded in the Ethernet Nx50G traffic. For example, each rate (such as 50G, 100G, 200G and 400G) has its own AM structure that is distinct but structurally similar. For example, an AM includes codes that arrive in certain frequency (or interval) and carry certain pre-defined values. Among other things, a function of AM framer 901 is to lock to AM sequence. In various embodiments, alignment markers are also used for parity check. For example, alignment markers are used to symbol align parity check code with RS symbols, as the RS FEC blocks are aligned to the alignment markers. By ordering FEC blocks using alignment markers, RS FEC blocks can be assigned to even and odd blocks (e.g., the first block or block "0" would be even, and the next block or block "1" would be odd, and so on). The interleaving module 902 as shown in FIG. 9 includes a delay line 903 and a bit-level multiplexer (MUX) 904. For example, for a block size of 5440 bits, delay line 903 delays 5440 bits (i.e., one FEC block size) of even blocks, and mux 904 interleaves between the odd blocks and delayed even FEC blocks.

Figure 10:
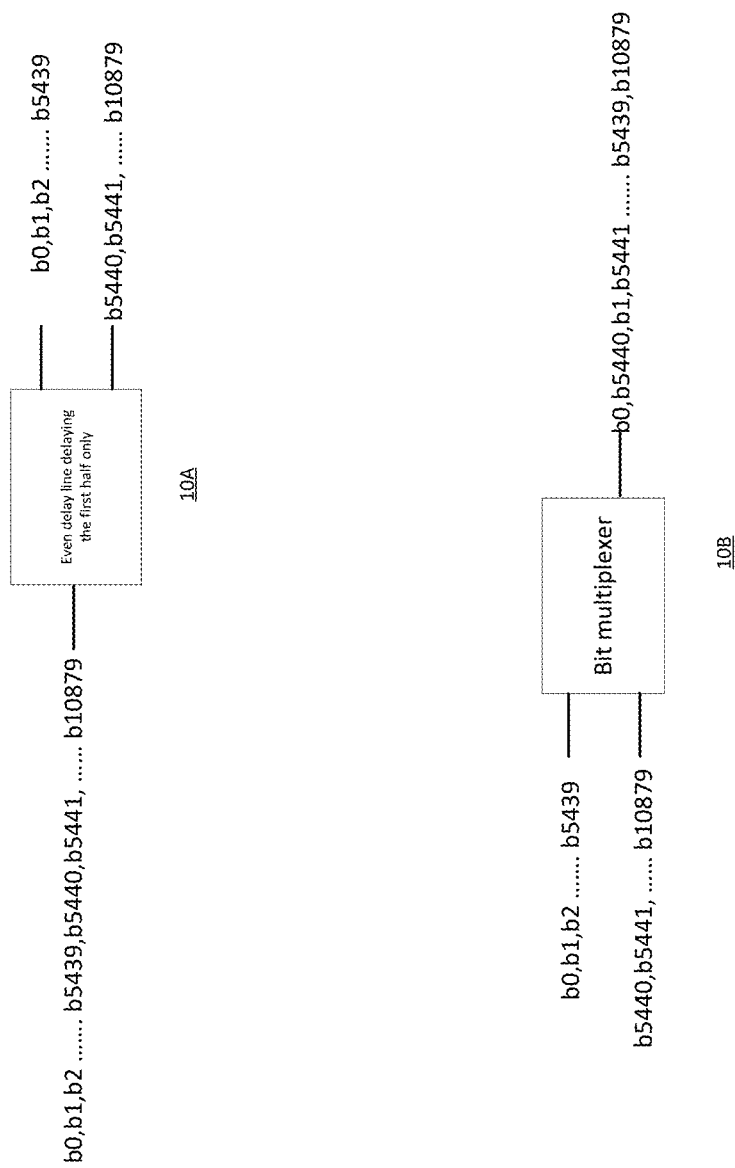
FIG. 10 is a simplified diagram illustrating data interleaving according to embodiments of the present invention.

FIG. 10 is a simplified diagram illustrating data interleaving according to embodiments of the present invention. This diagram is merely an example, which should not unduly limit the scope of the claims. One of ordinary skill in the art would recognize many variations, alternatives, and modifications. As shown on 10A, a data stream of 10880 bits (i.e., from bit $b_0$ to bit $b_{10879}$) is interleaved into two blocks. A first block (e.g., even block on top) includes bit $b_0$ to bit $b_{5439}$, while a second block (e.g., odd block on the bottom) includes bit $b_{5440}$ to bit $b_{10879}$. The even block is delayed by its block size of 5440 bits. It is to be appreciated that while block size in the exemplary embodiment is 5440, other block sizes are possible as well. Similarly, sequence of even and odd blocks may be altered depending on the implementation.

Now referring back to FIG. 9. The interleaved even and odd blocks are encoded with the soft FEC (SFEC) encoder 906. Depending on the implementation, a de-skew block 905 may be configured as shown to provide data alignment. Encoded data are then transmitted through physical medium dependent (PMD) transmission block 908. For example, data are transmitted through a PAM4 channel 508. The SFEC encoder 906 is configured to perform both FEC (e.g., RS or KP) encoding and parity bit encoding. The example, the SFEC encoder 906 performs SFEC encoding process illustrated in FIG. 2 and described above. The SPEC encoder 906 concatenates extra soft-TEC (i.e., parity check for even and odd FEC blocks) symbols to the existing (in the host or the device, and standard compliant) KP/RS FEC. As explained above, the total coding gain provided by the SFEC 906 is the sum of FEC coding gain and the parity bit coding gain. It is to be appreciated that by using interleaving and de-interleaving techniques, 50G and 100G communication can benefit from similar coding gain as 200G and 400G communication protocols with relatively small amount of additional hardware used for interleaving.

On other side of PAM4 channel 508, receiver PMD block 909 receives the data transmitted by transmission block 908 through PAM4 channel 908. The received data are first processed by a 20-bit framer 910 as shown, and then processed by SFEC decoder 911. It is to be appreciated that the SFEC decoder 911 makes use of both parity bits and FEC encoding. The decoded data are de-interleaved at block 912. De-interleaver 912, as shown, includes an AM framer 913, a de-mux 914, and a delay line 915. Among other features, AM framer 913 is configured to distinguish between even and odd blocks. The use of interleaving technique and AM framer 913 is specific to 50G and 100G implementations, as there are even and odd blocks that need to be distinguished by AM framer 913. As shown in FIG. 9, delay line 915 delays 5440 bits of data of the odd FEC blocks. As described above, even blocks were delayed at delay line 903 before SFEC encoding, and in symmetry, odd blocks are delayed at delay line 915. In various implementations, other framer formats or configurations may be used as well.

In FIG. 10, 10B illustrates that a bit multiplexer receives both even FEC block on top (bits $b_0$ to $b_{5439}$) and odd FEC block on the bottom (bits $b_{5440}$ to $b_{10879}$), and after delaying the odd block by 5440 bits, the output of the bit multiplexer is a continuous bit stream from bit $b_0$ to bit $b_{10879}$. Now referring back to FIG. 9. After de-interleaving, a continuous data stream (i.e., no more even and odd FEC blocks) is provided to the host.

In various embodiments, system 900 can operate in different modes. In certain implementations, interleaving is unnecessary (e.g., 200G and 400G modes) during SFEC encoding process, and the communication system can turn off or bypass the interleaving and de-interleaving blocks. There are other embodiments as well.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A method for data transmission, the method comprising:

receiving a data stream from a host device, the data stream as received from the host device including encoded data;

separating the encoded data in the data stream into first data blocks and second data blocks;

generating a first forward error correction (FEC) block, wherein the first FEC block includes a first parity section and a first data section, wherein the first parity section includes a first parity bit corresponding to the first data blocks and a second parity bit corresponding to the second data blocks, and wherein the first data section includes the first data blocks and the second data blocks; and transmitting the first FEC block.

2. The method of claim 1 further comprising aligning a first even block with a first odd block of the data stream.

3. The method of claim 1 wherein the encoded data in the data stream received from the host includes Reed Solomon (RS) encoded data.

4. The method of claim 1 wherein the FEC blocks are transmitted through a PAM4 channel.

5. The method of claim 1 wherein the data stream is transmitted in a 100G mode.

6. The method of claim 1 wherein the data stream is transmitted in a 50G mode.

7. The method of claim 1 wherein the first FEC block corresponds to a plurality of PAM4 symbols.

8. The method of claim 1 further comprising:
framing the data stream with alignment markers;
storing a first segment of data at a delay line, the first segment of data including a predetermined number of bits of the data stream;
generating a first data block based on the first segment of data;
generating a second data block based on a second segment of data, the second segment of data including the predetermined number of bits of the data stream;
storing a third segment of data at the delay line;
generating a third data block based on the third segment of data;
generating a fourth data block based on a fourth segment of data;
multiplexing the first data block and the second data block to output a first even block corresponding to the first data block and a first odd block corresponding to the second data block;
determining the first parity bit based on the first even block;
determining the second parity bit based on the first odd block;
multiplexing the third data block and the fourth data block to output a second even block corresponding to the third data block and a second odd block corresponding to the fourth data block;
determining a third parity bit corresponding to the second even block;
determining a fourth parity bit corresponding to the second odd block;
generating a second FEC block, the second FEC block including a second parity section and a second data section, the second parity section including the third parity bit and the fourth parity bit, the second data section including the second even block and the second odd block; and
transmitting the second FEC block.

9. The method of claim 1 wherein the method is compatible with the 802.3bs standard and 802.3cd standard.

10. The method of claim 1 wherein the first parity section provides at least 1.2 dB coding gain.

11. A method for data decoding, the method comprising:
receiving an encoded data stream, the encoded data stream including a plurality of PAM symbols;
generating an FEC block based the plurality of PAM symbols, the FEC block including a parity section and a data section, the parity section including a first parity bit and a second parity bit, the data section including an even block and an odd block;
performing parity check on the even block using the first parity bit;
performing parity check on the odd block using the second parity bit;
decoding the even block and the odd block;
storing the odd block at a delay line; and
generating a data stream including the even block and the odd block.

12. The method of claim 11 further comprising distinguishing between the even block and the odd block.

13. The method of claim 11 further comprising multiplexing the even block and the odd block.

14. The method of claim 11 further comprising mapping the plurality of PAM symbols.

15. The method of claim 11 wherein the PAM symbols comprise PAM4 symbols.

16. A method for data decoding, the method comprising:
receiving an interleaved data stream comprised of a plurality of PAM symbols;
generating an FEC block comprised of the plurality of PAM symbols in the data stream, the FEC block including a parity symbol, a plurality of odd symbols, and a plurality of even symbols interleaved with the plurality of odd symbols;
performing parity check using the parity symbol and the odd symbols;
generating even blocks and odd blocks corresponding to the interleaved pluralities of even symbols and odd symbols;
delaying the odd blocks by a predetermined number of bits; and
de-interleaving the even blocks and the odd blocks to generate a de-interleaved data stream.

17. The method of claim 16 wherein the predetermined number of bits equals to a block size of the even blocks.

18. The method of claim 16 further comprising multiplexing the even blocks and the odd blocks into the de-interleaved data stream.

19. The method of claim 16 further comprising distinguishing between the even blocks and the odd blocks.

20. The method of claim 16 further comprising mapping the PAM symbols to generate the FEC block.

* * * * *